United States Patent

Krach

(10) Patent No.: US 7,321,235 B2
(45) Date of Patent: Jan. 22, 2008

(54) INPUT CIRCUIT FOR AN INTEGRATED CIRCUIT

(75) Inventor: Markus Krach, Freising (DE)

(73) Assignee: Infineon Technologies AG, Munich (DE)

( * ) Notice: Subject to any disclaimer, the term of this patent is extended or adjusted under 35 U.S.C. 154(b) by 96 days.

(21) Appl. No.: 11/291,514

(22) Filed: Dec. 1, 2005

(65) Prior Publication Data

US 2006/0150039 A1    Jul. 6, 2006

(30) Foreign Application Priority Data

Dec. 1, 2004   (DE)   ............ 10 2004 057 819

(51) Int. Cl.
   *G01R 31/02*   (2006.01)
(52) U.S. Cl. ................... 324/765; 324/763
(58) Field of Classification Search ........ 324/760–765, 324/158.1; 365/200–201, 189.01; 714/718, 714/724–73

See application file for complete search history.

(56) References Cited

U.S. PATENT DOCUMENTS

| 5,124,589 | A | * | 6/1992 | Shiomi et al. ............... 326/43 |
| 5,734,661 | A | * | 3/1998 | Roberts et al. ............. 714/733 |
| 6,349,397 | B1 | * | 2/2002 | Koga et al. ................. 714/727 |
| 6,598,187 | B1 | | 7/2003 | Koto |
| 6,788,087 | B2 | * | 9/2004 | Schnabel .................... 324/763 |

* cited by examiner

*Primary Examiner*—Vinh P. Nguyen
(74) *Attorney, Agent, or Firm*—Patterson & Sheridan, L.L.P.

(57) ABSTRACT

An integrated circuit includes a functional circuit, a setting memory for storing a setting data item and an input circuit for receiving signals via an input terminal. The input circuit includes a first receiving circuit having first hysteresis and a second receiving circuit having second hysteresis wherein the input circuit connects either the first or the second receiving circuit to the input terminal on the basis of the setting data item in order to receive the signals and to provide the functional circuit with the signals.

10 Claims, 2 Drawing Sheets

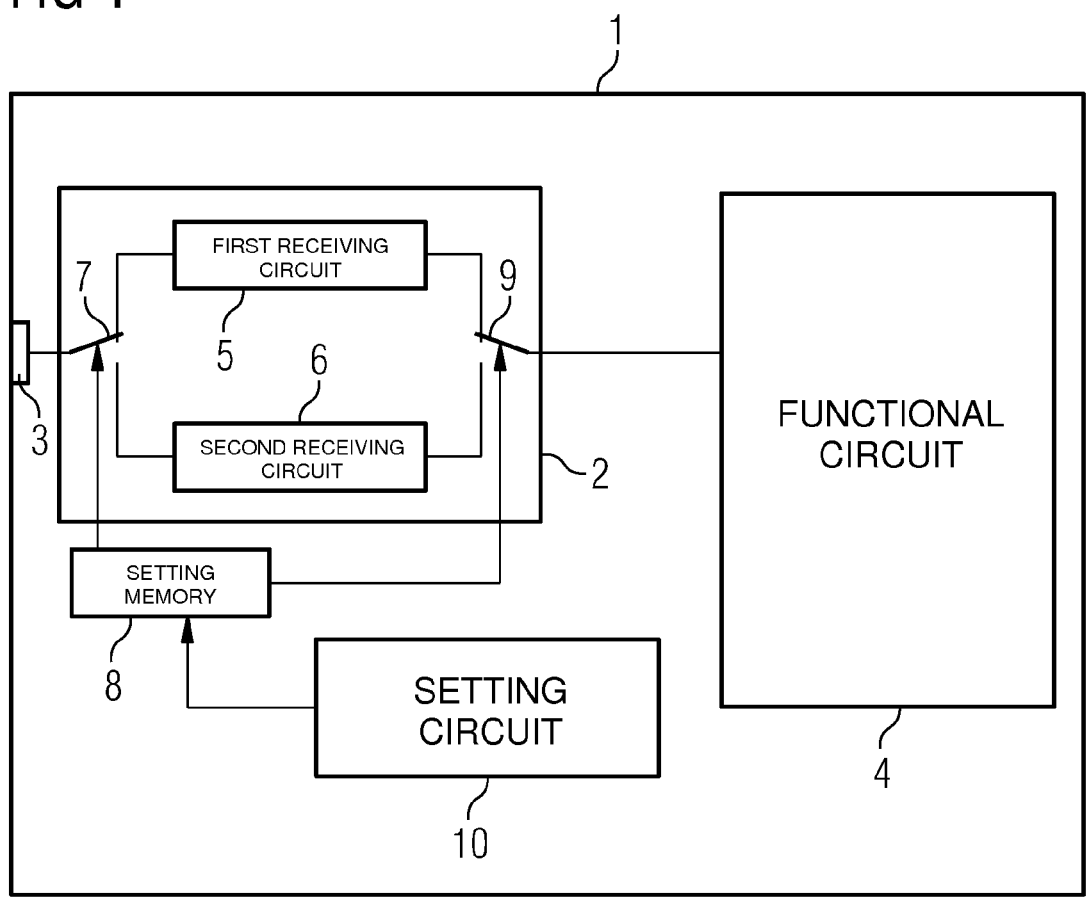

INPUT CIRCUIT FOR AN INTEGRATED CIRCUIT

CROSS-REFERENCE TO RELATED APPLICATIONS

This application claims foreign priority benefits under 35 U.S.C. § 119 to co-pending German patent application number DE 10 2004 057 819.2, filed 1 Dec. 2004. This related patent application is herein incorporated by reference in its entirety.

BACKGROUND OF THE INVENTION

1. Field of the Invention

The invention relates to an integrated circuit having an input circuit for receiving signals via an input terminal. In particular, the invention relates to an integrated circuit which can be put into a burn-in mode in order to pre-age the integrated circuit and which can be operated in a conventional manner after the burn-in operation.

2. Description of the Related Art

In conventional burn-in test systems for carrying out a burn-in method, a plurality of integrated modules are simultaneously subjected to a stress condition and are tested in the process. However, when initializing and driving the integrated modules which are to be tested in the burn-in method, only very slow signal ramps are possible since the tester channels provided for this purpose are simultaneously connected to a plurality or all of the integrated modules. In addition, the tester channels have a considerable amount of noise on account of their length, with the result that the input signals which are applied to the integrated modules are subjected to considerable signal disturbances. Specifically, in the case of a burn-in test system, the influence of the noise voltage on the tester channels may be ±100 mV. Noise in a clock signal or in a reference voltage signal may be interpreted as an additional clock pulse in the integrated modules, which may impair communication between the burn-in test system and the integrated modules.

In order to test integrated modules in a burn-in test system, the integrated modules are put into a test mode and are operated under extreme operating conditions, for example an increased ambient temperature, an increased supply voltage level and the like, as a result of which faults occur in susceptible integrated modules, with the result that said faults can be selected in a subsequent test operation. For the burn-in test operation, the integrated modules are usually operated in a burn-in mode which is assumed as a result of a particular signal sequence that is applied to the inputs of the integrated module.

An additionally interpreted clock pulse or a disturbance in a signal when applying the signal sequence for setting the burn-in mode in the integrated module may result in one of the signals in the particular signal sequence being detected twice during the test mode input sequence, with the result that the burn-in mode is not assumed under certain circumstances. In this case, the integrated module is not subjected to the burn-in test operation, with the result that the integrated module is not properly pre-aged.

The integrated modules have input circuits which can be used to receive externally applied signals. In order to be insensitive to input-side noise during the burn-in test operation, the input circuits of the integrated module must have sufficient hysteresis so that the noise does not lead to an additional clock edge, for example. However, input circuits having such high hysteresis are disadvantageous and are too slow for integrated modules having high transmission rates since the maximum operating frequency of the integrated modules is limited by the high hysteresis. By way of example, hysteresis of, at most, ±75 mV is permissible for an SDRAM module, in particular for a DDRII SDRAM 512 M T90, given an operating frequency of 590 MHz.

SUMMARY OF THE INVENTION

It is an object of the present invention to provide an integrated circuit having an input circuit, in which it is possible to ensure that, when noisy input signals from a burn-in test system are applied, the burn-in test mode can be set in the integrated modules, and in which the input circuit is simultaneously suitable for the high operating frequencies during normal operation.

In accordance with a first aspect of the present invention, provision is made of an integrated circuit having a functional circuit, a setting memory for storing a setting data item and an input circuit. The input circuit is used to receive signals via an input terminal and has a first receiving circuit having a first hysteresis and a second receiving circuit having a second hysteresis. The input circuit is provided in such a manner that either the first or the second receiving circuit is connected to the input terminal on the basis of the setting data item in order to receive the signals and to provide the functional circuit with said signals.

The integrated circuit of the present invention thus provides two receiving circuits which have different hysteresis depending on the requirements which the input circuit has to satisfy. The first receiving circuit having the first hysteresis may thus be used to receive an input signal if the input signal is noisy and is provided at a relatively low signal frequency. This is the case, for example, in a burn-in test system in which a plurality of integrated circuits are supplied with input signals via a tester channel. During normal operation, the integrated circuit may receive the input signals via the second receiving circuit having second hysteresis which is, for example, lower than the first hysteresis so that input signals at higher signal frequencies may be received.

In accordance with one embodiment, the input circuit may have a switch which connects either the first or the second input circuit to the input terminal on the basis of the setting data item. In particular, the setting memory can be set to a first value after the integrated circuit has been fabricated in order to connect the first receiving circuit to the signal terminal.

A setting circuit may also be provided in order to write a second value to the setting memory on the basis of a received signal sequence so that the second receiving circuit is activated. This makes it possible to provide the integrated circuit in such a manner that it first connects the first receiving circuit to the input terminal after said integrated circuit has been completed. If it is indicated, in accordance with a signal sequence, that the burn-in mode has been concluded, the setting circuit is used to change the value stored in the setting memory so that the second receiving circuit is connected to the input terminal.

The setting memory is preferably configured in such a manner that the second value is permanently stored after the second value has been written to said setting memory. In particular, the setting memory may be configured in such a manner that it prevents further writing after the second value has been written to it. This rules out the possibility of the end user writing to the setting memory, by applying a suitable signal sequence, in such a manner that the first receiving circuit is connected to the input terminal and the integrated module has impaired properties under certain circumstances. Alternatively, provision may be made for the setting circuit to prevent further writing to the setting memory after the second value has been written to the latter.

In accordance with a preferred embodiment, the setting memory has an electrical fuse which, after the burn-in test operation has been concluded, is set in such a manner that the second receiving circuit is connected to the input terminal.

In accordance with a preferred embodiment, the hysteresis of the first embodiment may be designed in such a manner that, in a burn-in test operation, external signals which are noisy and have a first, low edge steepness are reliably received, the hysteresis of the second receiving circuit being designed in such a manner that signals having a second, high edge steepness (high frequency) are detected more rapidly than in the first receiving circuit. In particular, the hysteresis of the first receiving circuit is higher than the hysteresis of the second receiving circuit.

In accordance with another aspect of the present invention, provision is made of a method for testing an integrated circuit in a burn-in test operation. In this case, a first signal sequence is first of all applied in order to put the integrated circuit into a burn-in mode, a second signal sequence being applied to the integrated circuit after the burn-in test operation has been concluded, as a result of which the setting data item is written to the setting memory so that the second receiving circuit is connected to the signal terminal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 shows a block diagram of an integrated circuit in accordance with one preferred embodiment of the invention.

DETAILED DESCRIPTION OF THE PREFERRED EMBODIMENT

Figure 2A:
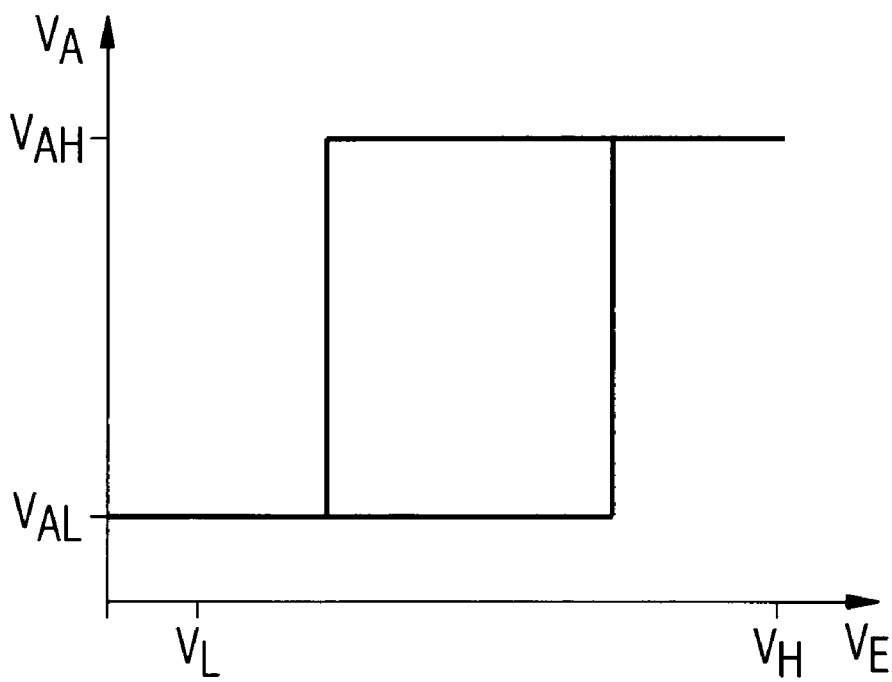
FIGS. 2a and 2b show the transfer characteristic of the receiving circuit of the integrated circuit shown in FIG. 1.

FIG. 1 diagrammatically illustrates a block diagram of an integrated circuit 1 having an input circuit 2 in order to receive an input signal that is applied to an input terminal 3 and to provide a functional circuit 4 with said signal for processing the received signals further. In the exemplary embodiment shown, only one input circuit 2 is illustrated. However, it goes without saying that integrated circuits usually have a multiplicity of such input circuits. The functional circuit 4 may be any desired circuit selected from a logic circuit, a memory circuit, a sensor circuit and the like which may be integrated in the integrated circuit 1.

The input circuit 2 has a first receiving circuit 5 and a second receiving circuit 6. Both the first and the second receiving circuit 5, 6 can be connected to the input terminal 3 via a switch 7. The switch 7 is driven by an output of a setting memory 8, with the result that the information stored in the setting memory 8 determines the switching state of the switch 7. In order to disconnect the respective output of the unused receiving circuit 5, 6 from the functional circuit 4, provision may optionally be made of a further switch 9 which selectively connects the outputs of the receiving circuits 5, 6 to the functional circuit 4 and disconnects the output of the respective other receiving circuit 5, 6 from the functional circuit 4. Like the switch 7, the further switch 9 is set on the basis of the contents of the setting memory 8.

The integrated circuit 1 also has a setting circuit 10 which writes to the setting memory 8 on the basis of the operating mode in which the integrated circuit is intended to be operated.

The integrated circuit 1 is operated as follows: after the integrated circuit 1 has been fabricated, a particular value is stored in the setting memory 8 in order to set the switch 7 and the further switch 9 in such a manner that the input terminal 3 is connected to the first receiving circuit 5 of the input circuit 2 and the output of the first receiving circuit 5 is connected to the functional circuit 4. By way of example, a logic zero is stored in the setting memory 8. After the integrated circuit 1 has been completed, the integrated circuit 1 is usually subjected to a burn-in test operation in which the integrated circuit 1 is pre-aged, i.e. is operated under extreme operating conditions, for example an increased ambient temperature, an increased supply voltage and the like. Since the burn-in test operation is effected by testing a plurality of identical integrated circuits 1 in parallel in a burn-in test system (not shown), the input signals for the integrated circuits are applied to a number of integrated circuits via a tester channel. As a result of the large load on the tester channel, which is caused both by the length of the tester channel and by the capacitances of the signal inputs 3 of the integrated circuits 1, the signal edges of the input signals, including a clock signal provided by the burn-in test system, are very flat (approx. 100 mV/ns) in contrast to the signal edges during normal operation (approx. 60 mV/ns) and are encumbered with a relatively large noise signal on account of the high sensitivity to disturbance signals. Under certain circumstances, the noise signal may have orders of magnitude of ±100 mV or more. On account of the long residence time of the signal between the hysteresis threshold values, the risk of an unstable state when using the second receiving circuit 6 (which is designed for normal operation) in the burn-in test operation would be high.

So that the signal at the input terminal 3 is correctly determined by the first receiving circuit 5 during the burn-in test operation, the first receiving circuit 5 is provided such that it has relatively high hysteresis, as is qualitatively illustrated in FIG. 2a. The input potential levels of the input signal are illustrated on the X-axis and the output potential levels at the output of the first receiving circuit 5 are illustrated on the Y-axis. It can be seen that the first receiving circuit 5 has relatively high hysteresis in order to ensure that the noise signal in the input signal does not lead to unwanted changes in the level at the output of the first receiving circuit 5. After the burn-in operation has been concluded, a new value, for example a logic "1", is written to the setting memory 8 so that the switch 7 connects the signal input 3 to the second receiving circuit 6 and connects the output of the second receiving circuit 6 to the functional circuit 4 via the further switch 9.

Figure 2B:
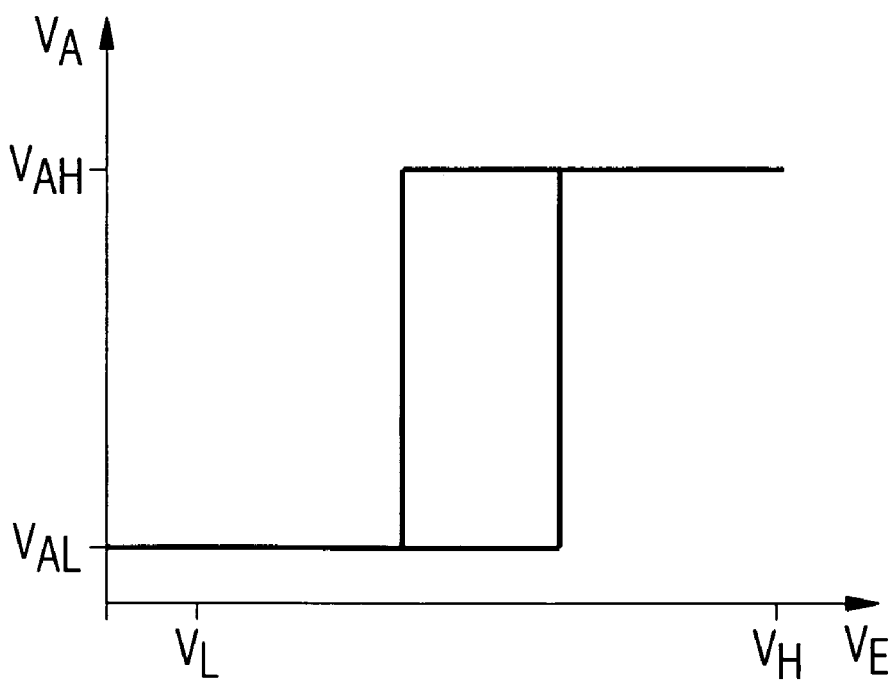

The transfer response of the second receiving circuit 6 is shown in FIG. 2b. The second receiving circuit 6 has second hysteresis but the second hysteresis is considerably lower than in the first receiving circuit. Under certain circumstances, it may even be possible to largely dispense with the provision of second hysteresis. The second hysteresis of the second receiving circuit ensures that signals which are applied to the signal input can be detected more rapidly, and signals can thus be transmitted more rapidly to the integrated circuit 1. By way of example, the hysteresis of the first receiving circuit 5, i.e. the potential distance between two switching thresholds, is approximately 100 mV and the hysteresis of the second receiving circuit is approximately 75 mV.

The hysteresis of the first receiving circuit differs from the hysteresis of the second receiving circuit by virtue of the fact that the switching threshold is increased for a rising edge and is decreased for a falling edge. This may be effected using refinements (which are known to a person skilled in the art) of receiving circuits. The setting memory 8 may be written to or programmed, for example, by the setting circuit 10 if the latter is instructed to conclude the burn-in operating mode of the integrated circuit 1. The setting circuit 10 may be informed of this, for example, using an externally applied signal sequence.

The setting memory 8 is preferably in the form of a permanent memory which even stores its contents irrespective of the application of a supply voltage. Provision may also be made for the setting memory to be a memory which can be written to only once, with the result that, after the setting memory 8 has been written to in order to connect the second receiving circuit 6 to the signal input 3, it is no longer possible to connect the first receiving circuit 5 to the signal input 3. This makes it possible to prevent the first receiving circuit 5 being unintentionally connected to the signal input during normal operation. In particular, provision may be made for the setting memory 8 to be in the form of an electrical fuse element which can be written to using a programming current and for the value which is set after writing with the programming current to no longer be variable. As an alternative to the setting circuit 10, the setting memory 8 can also be externally written to directly using suitable input terminals.

While the foregoing is directed to embodiments of the present invention, other and further embodiments of the invention may be devised without departing from the basic scope thereof, and the scope thereof is determined by the claims that follow.

What is claimed is:

1. An integrated circuit, comprising:
   a functional circuit;
   a setting memory for storing a setting data item; and
   an input circuit for receiving signals via an input terminal, the input circuit comprising a first receiving circuit having a first hysteresis and a second receiving circuit having a second hysteresis; the input circuit selectively connecting either the first or the second receiving circuit to the input terminal depending on a value of the setting data item in order to receive the signals and to provide the functional circuit with the signals.

2. The circuit of claim 1, wherein the input circuit further comprises a switch which connects either the first or the second receiving circuit to the input terminal depending on the value of the setting data item.

3. The circuit of claim 1, further comprising a setting circuit coupled to the setting memory and configured to set the value of the setting data item in the setting memory to a first value during a first mode of operation of the functional circuit and set the value of the setting data item in the setting memory to a second value during a second mode of operation of the functional circuit.

4. The circuit of claim 1, further comprising a setting circuit coupled to the setting memory and configured to set the value of the setting data item in the setting memory to one of a first value and a second value; wherein the setting memory is configured in such a manner that the setting memory permanently stores the second value after the second value has been written to the setting memory.

5. The circuit of claim 1, further comprising a setting circuit coupled to the setting memory and configured to set the value of the setting data item in the setting memory to one of a first value and a second value; wherein the setting memory is configured to be incapable of being written to further after the second value has been written to the setting memory.

6. The circuit of claim 1, further comprising a setting circuit coupled to the setting memory and configured to set the value of the setting data item in the setting memory to one of a first value and a second value; wherein the setting circuit is configured to be incapable of being writing to the setting memory after the second value has been written to the setting memory.

7. The circuit of claim 1, further comprising a setting circuit coupled to the setting memory and configured to set the value of the setting data item in the setting memory to one of a first value and a second value; wherein the setting memory comprises an electrical fuse rendering the setting memory incapable of being written to further after the second value has been written to the setting memory.

8. The circuit of claim 1, wherein the first hysteresis of the first receiving circuit is selected such that, in a burn-in test operation, noisy signals having a low edge steepness are reliably received, and the second hysteresis of the second receiving circuit is selected such that signals having a high edge steepness are detected more rapidly than in the first receiving circuit.

9. The circuit of claim 1, wherein the first hysteresis of the first receiving circuit is higher than the second hysteresis of the second receiving circuit.

10. The circuit of claim 1, wherein the functional circuit is a dynamic random access memory device.

* * * * *